US005615084A

United States Patent [19]
Anderson et al.

[11] Patent Number: 5,615,084
[45] Date of Patent: Mar. 25, 1997

[54] ENHANCED FLOW DISTRIBUTOR FOR INTEGRATED CIRCUIT SPOT COOLERS

[75] Inventors: Timothy M. Anderson; Gregory M. Chrysler; Robert E. Simons, all of Poughkeepsie, N.Y.

[73] Assignee: International Business Machines Corporation, Armonk, N.Y.

[21] Appl. No.: 497,496

[22] Filed: Jun. 30, 1995

[51] Int. Cl.[6] ................................. H05K 7/20
[52] U.S. Cl. .............. 361/697; 165/80.3; 165/121; 361/719; 415/178; 415/213.1
[58] Field of Search .................. 361/690, 694, 361/695, 697, 704, 707, 709, 710, 717–719; 165/121–126, 80.3, 185; 174/16.1, 16.3; 310/68 C, 68 D; 257/722; 312/236; 454/184; 416/223 R; 415/115, 177, 178, 208.3, 208.4, 213.1, 214.1

[56] References Cited

U.S. PATENT DOCUMENTS

| | | | |
|---|---|---|---|
| 5,297,617 | 3/1994 | Herbert | 165/80.3 |
| 5,309,983 | 5/1994 | Bailey | 165/80.3 |
| 5,377,745 | 1/1995 | Hsieh | 165/80.3 |
| 5,475,564 | 12/1995 | Chiou | 361/704 |
| 5,504,650 | 4/1996 | Katsui | 361/697 |

*Primary Examiner*—Gerald P. Tolin
*Attorney, Agent, or Firm*—Lawrence D. Cutter

[57] ABSTRACT

A parallel plate heat sink used in conjunction with an air moving device which provides an annular flow of air against the heat sink is further provided with enhanced flow deflector means which selectively block potential exhaust paths so as to redirect the flow of air to the region under a central hub of the fan. This transforms otherwise stagnant air volume in the center of the heat sink into a primary cooling region thus lowering conduction losses and electronic component junction temperatures.

7 Claims, 4 Drawing Sheets

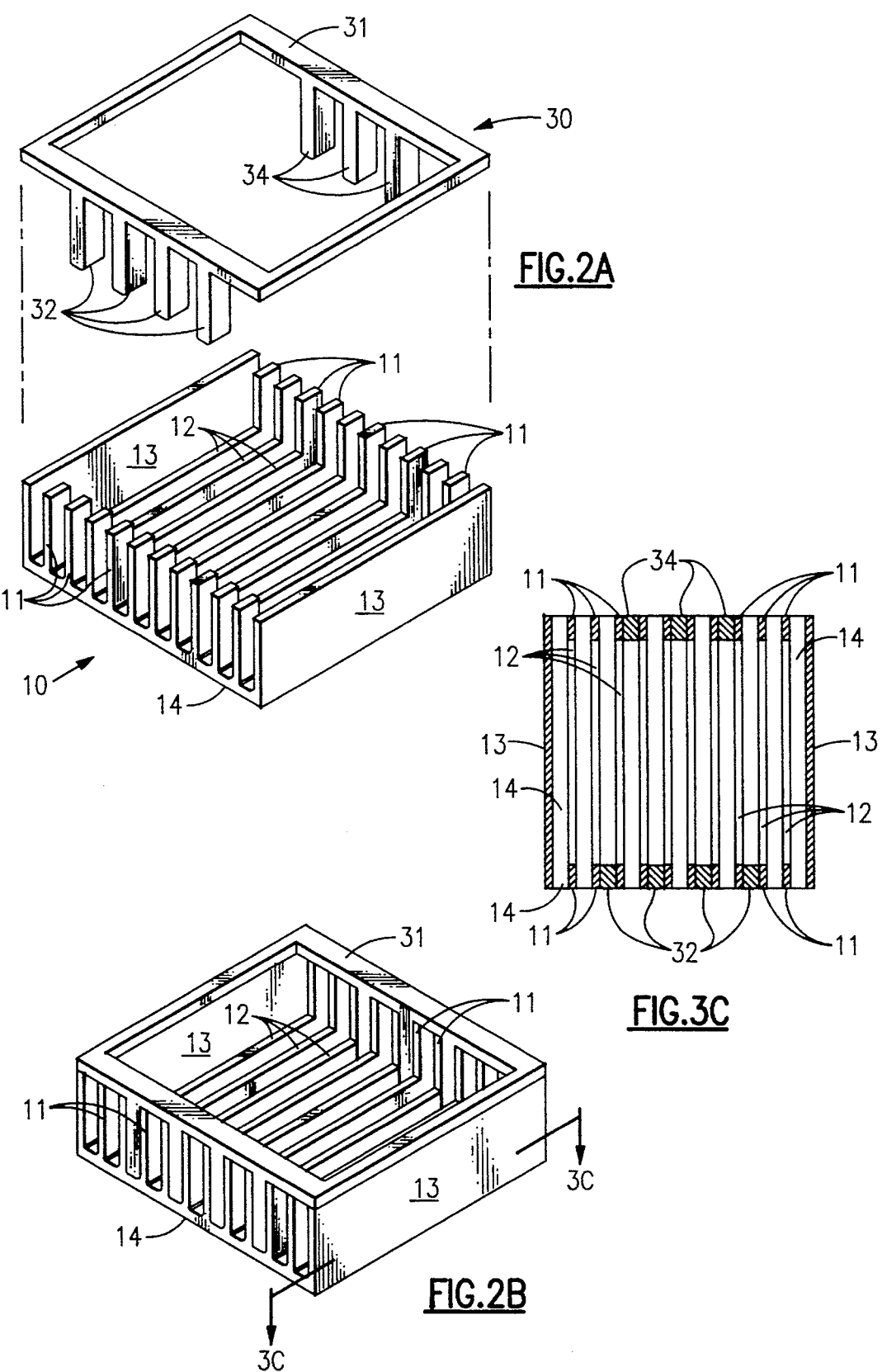

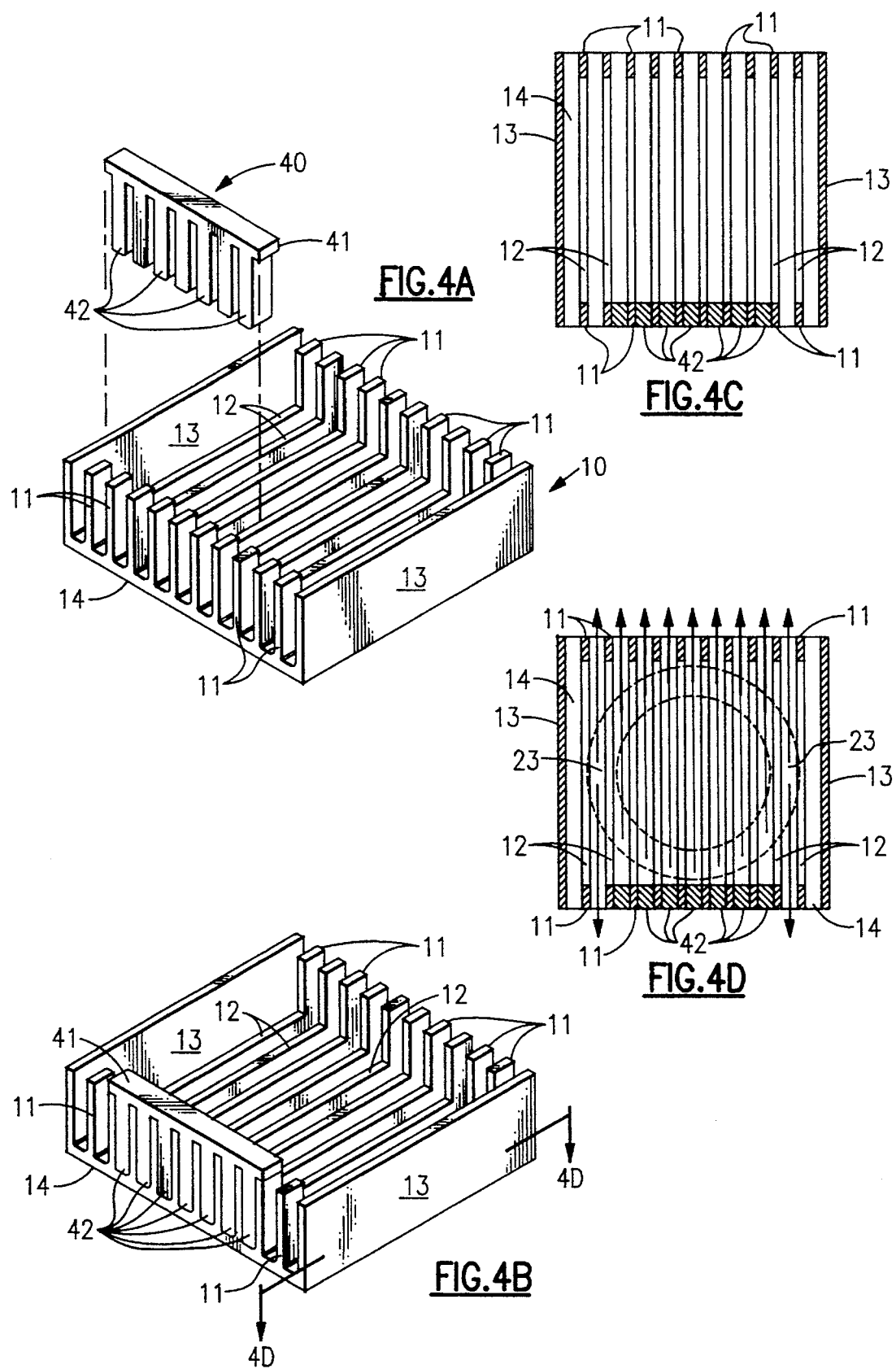

ENHANCED FLOW DISTRIBUTOR FOR INTEGRATED CIRCUIT SPOT COOLERS

BACKGROUND OF THE INVENTION

The present invention is generally directed to spot cooling devices for use in conjunction with integrated circuit electronic devices principally, though not exclusively, in the form of Single Chip Modules (SCMs). More particularly, the present invention is directed to a method and apparatus for improving air flow through the fins of a heat sink. Even more particularly, the present invention is directed to a method and apparatus for enhancing the flow of air in spot cooling devices which comprise combinations of fans and heat sinks.

As a result of the quest for faster and more functional electronic processing chips, single chip module heat dissipation levels are climbing beyond that which can be cooled using conventional heat sinks. In many applications, spot cooling methods are employed for high powered single chip modules. These single chip modules include not only processor chips but also communications and other chips which are operated at high power levels due to chip circuit density, speed of operation or both. Spot coolers are employed because the acceptable air speeds within various electronic systems are not sufficient to provide proper cooling. Additionally, spot coolers are employed because available space for cooling hardware is limited. And lastly, spot coolers are employed because the electronic system may not have been originally designed to accommodate a high powered component which is currently being employed or which is desired to be employed.

A popular, but suboptimal, solution to this thermal challenge involves attaching a miniature tubeaxial fan on to the top of a low profile heat sink. One manufacturing technique to achieve this end is the placement of the tubeaxial fan in a pocket in an extruded aluminum, parallel-plate heat sink. Such pockets are specifically designed for the insertion of these fans. Another manufacturing technique uses die casting to form parallel plate heat sinks with a cast shape which includes a pocket to receive a small fan.

The fans, or more generally, the air moving devices, with which this invention is most directly concerned, are of the so-called muffin fan variety. The relevant features of these fans or air moving devices with respect to the present invention is that the fans include a centrally disposed motor together with a set of fan blades which are rotated by the motor so as to cause the fan blades to rotate within an annular volume. The fan motor itself may form the central region bounded by this annular volume but generally, the motor itself is not required to be present in a region which is actually surrounded by the annular volume. For purposes of the present invention, the most relevant feature of the air moving device which is employed is that the device causes air to flow in an annular volume toward the object which is desired to be cooled.

This approach suffers from a very poor match between the heat distribution pattern within the electronic chip device and the air flow velocity profile of the tubeaxial fan. Specifically, the heat dissipated by the heat sink is typically concentrated as a high thermal flux in the center of the electronic package, whereas the fan delivers little or no air flow to the central region of the heat sink. Rather, the fan provides the outer portion of the heat sink with the highest air flow velocity and heat transfer coefficient. This means that the heat path is from the chip to the heat sink base, laterally through the base to the outer fins and finally into the air flow. However, lateral heat conduction through the heat sink base smears the flux concentration away from the center at the cost of conduction (spreading) losses. This heat flow pattern ultimately results in higher electronic device junction temperatures. Consequently, the present inventors have perceived that a design which delivers air flow to the fins in the center of the heat sink provides superior cooling, lower junction temperature and therefore greater circuit reliability.

SUMMARY OF THE INVENTION

In accordance with a preferred embodiment of the present invention, a heat removal apparatus for an electronic module or chip comprises a heat sink with parallel plate fins which are configured to provide a recess for a fan or other air moving device. At least some fin structure is present beneath the fan. The fan is disposed within the recess provided in the fin structure and possesses a central motor with blades which rotate in an annular volume in the vicinity of the motor. More particularly, with respect to the present invention, air flow directing means are provided to enhance the flow of air in a direction parallel to the fins in the area beneath the central fan motor. In this way, cooling fluid is provided to that portion of the electronic chip which is typically in greatest need of cooling, namely its central portion. Accordingly, a method is provided herein to enhance the flow of cooling air to the critical region of a low profile integrated fan/heat-sink spot cooler by selectively blocking potential exhaust paths so as to redirect the flow of air as desired to the region beneath the fan hub. In effect, this transforms the otherwise stagnant air volume in the center of the heat sink into the primary cooling region. This design reduces conduction losses and ultimately also lowers junction temperatures.

In one preferred embodiment of the present invention, the air flow directing means comprises a plurality of staggered teeth mounted on a substantially annular frame which is readily retrofitted to existing heat sink structures. In another embodiment of the present invention, the air flow directing means simply comprises a base member with slot blocking teeth which depend from the base member and which are sized and positioned to block the ends of the channels defined by the fin structure. In yet another embodiment of the invention, an air flow directing means comprises patterned panels which are adhesively bonded to the sides of the heat sink. In any of these embodiments, the relevant effect is the creation of air flow beneath the central hub of the fan.

Accordingly, it is an object of the present invention to enhance the reliability of electronic circuit devices.

It is also another object of the present invention to enable electronic circuit chip devices to be operable at higher speeds.

It is yet another object of the present invention to maximize the utilization of cooling channel volume found within heat sink devices.

It is a still further object of the present invention to be able to simply retrofit existing cooling structures to improve air flow therein.

It is also an object of the present invention to enhance the operation of tubeaxial fans, particularly such fans that are used in conjunction with parallel plate heat sinks.

It is a still further object of the present invention to permit electronic chip devices to operate at lower junction temperatures, thus prolonging their useful life and enhancing their reliability.

It is yet another object of the present invention to provide retrofitable components which may be added to existing cooling units to enhance their thermal cooling characteristics.

It is also an object of the present invention to provide a method for directing cooling air to the central region of a low profile integrated fan/heat-sink spot cooler.

It is also another object of the present invention to selectively block potential exhaust paths in a parallel plate heat sink so as to redirect air flow to a region beneath the hub of a cooling fan.

It is also an object of the present invention to eliminate or reduce the presence of a stagnant air volume in a parallel plate heat sink used in conjunction with a cooling fan.

Lastly, but not limited hereto, it is an object of the present invention to provide an easily manufacturable enhanced flow distributor for spot cooling electronic circuit chips, single chip modules.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 2A is an exploded isometric view illustrating the use of an enhanced flow distributor in conjunction with the heat sink structure seen in FIG. 1A;

FIG. 2B is an isometric view illustrating a heat sink structure with the enhanced flow distributor of the present invention already inserted therein;

FIG. 3C is a cross-sectional top view of the cooling device shown in FIG. 3B;

FIG. 4A is an exploded isometric view illustrating the utilization of an alternative enhanced flow distributor;

FIG. 4B is a view similar to FIG. 4A but more particularly showing the already inserted enhanced flow distributor;

FIG. 4C is a top cross-sectional view of the assembled device from FIG. 4B; and

FIG. 4D is a top cross-sectional view similar to FIG. 4C but more particularly illustrating air flow beneath the hub of the fan.

DETAILED DESCRIPTION OF THE INVENTION

Figure 1A:
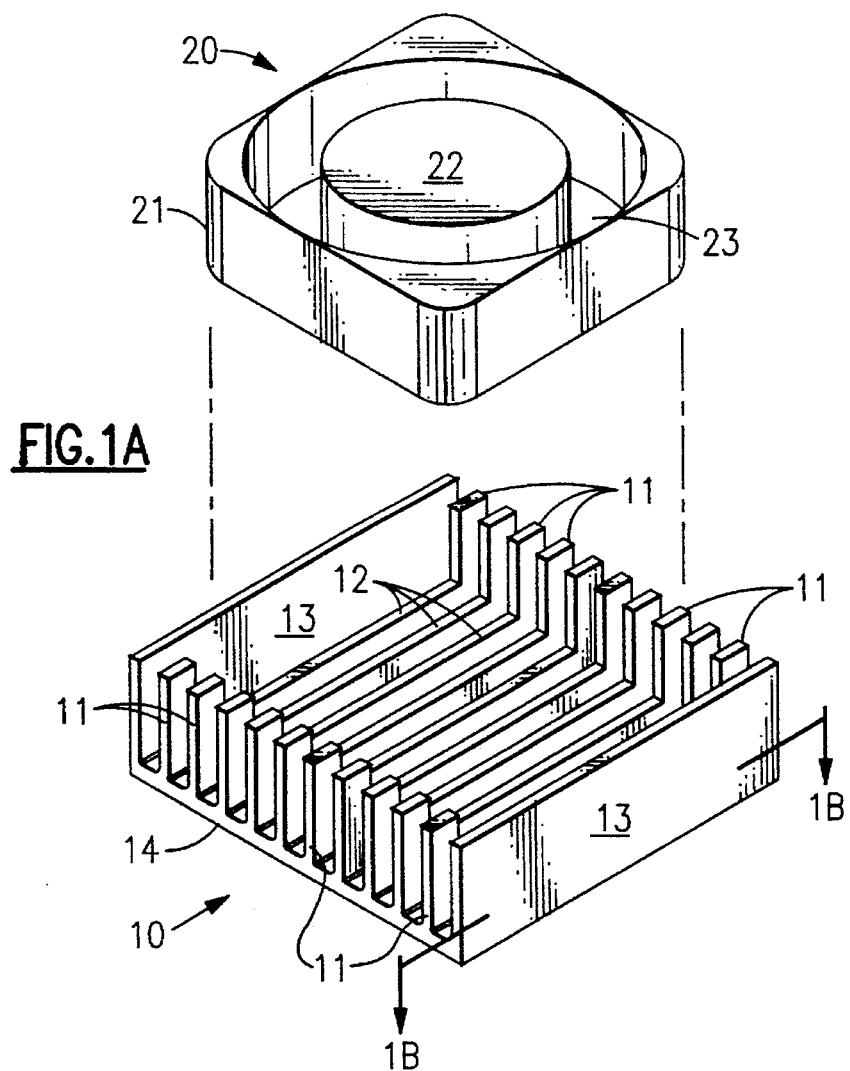
FIG. 1A is an exploded isometric view of an integrated fan/heat-sink spot cooler combination.

FIG. 1A illustrates a fan/heat-sink whose design is improved by the utilization of an enhanced flow distributor in accordance with preferred embodiments of the present invention. In particular, it is seen that heat sink 10 includes base portion 14 which is meant to be placed in contact with the object to be cooled. While base 14 is shown herein as being flat, it is noted that, in general, it may be made to conform to whatever surface is appropriate for maximal thermal contact. Base portion 14 also includes a plurality of fins 12 which lie at the bottom of a recess which is meant to receive fan 20. In one method of manufacture, the recess is formed by removing the upper portions of parallel plate fins so as to leave only end portions 11. Fins 13 at the end of the row of fins are left intact. Alternatively, heat sink 10 shown in FIG. 1A may be formed from a single casting.

In either method of manufacture, fan 20 is sized to be disposed within the recess created. Nonetheless, fin portions 12 at the bottom of the recess are desired to provide the air flow paths. The primary characteristic of fan 20 is that it include central motor 22 which is supported by housing 21 which is preferably sized to fit snugly within heat sink 10. The other relevant feature of fan 20 is the presence therein of annular volume 23 within which the blades (not shown for clarity) of fan 20 rotate. The structure described by reference numeral 20 is typically referred to as a muffin fan. However, it is noted that the principles of the present invention are applicable to fans of any size as long as they include a central hub or motor or provide a stream of air (or other cooling fluid) which moves through cylindrically annular volume.

Figure 1B:
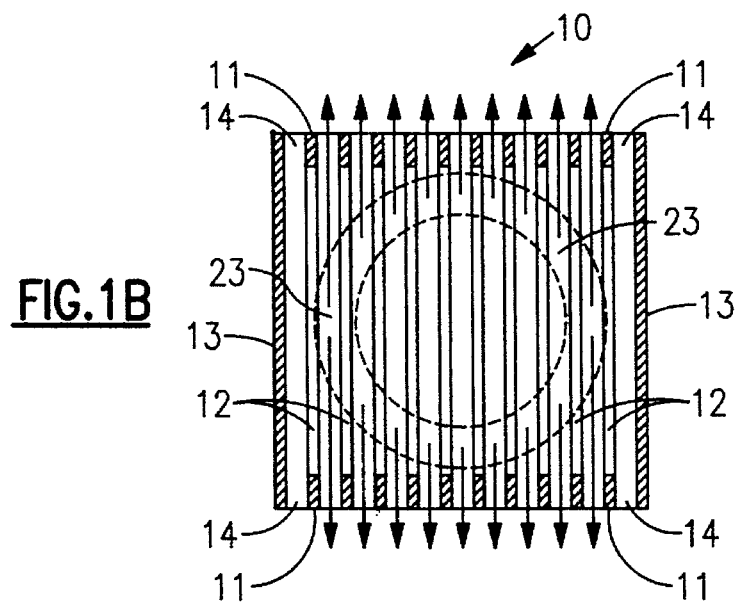
FIG. 1B is a top view of the structure shown in FIG. 1A which particularly illustrates air flow direction.

The problem with the structure shown in FIG. 1A is more particularly perceived in the air flow diagram of FIG. 1B. In particular, it is seen that air exits both sides of heat sink 10 but yet does not pass through the central region beneath fan hub 22. Thus, a potentially critical portion of the device which is to be cooled receives suboptimal benefit from the air flow generated by fan 20.

A solution to this problem is provided by the inclusion of enhanced flow distributor 30 such as that seen in FIG. 2A. In one preferred embodiment of the present invention, the enhanced flow distributor comprises an annular, or substantially annular, frame 31 from which teeth 32 project. Frame 31 is preferably sized and shaped to conform to the exterior top dimensions of heat sink 10. Likewise, teeth 32 are sized and positioned to fit snugly into the channels defined by parallel plate fins 11 and 12. Enhanced flow distributor 30 may comprise any convenient material including metals but preferably comprises a polymeric material which may be readily inserted into heat sink 10 and held in place therein by friction fit.

Figure 3A:
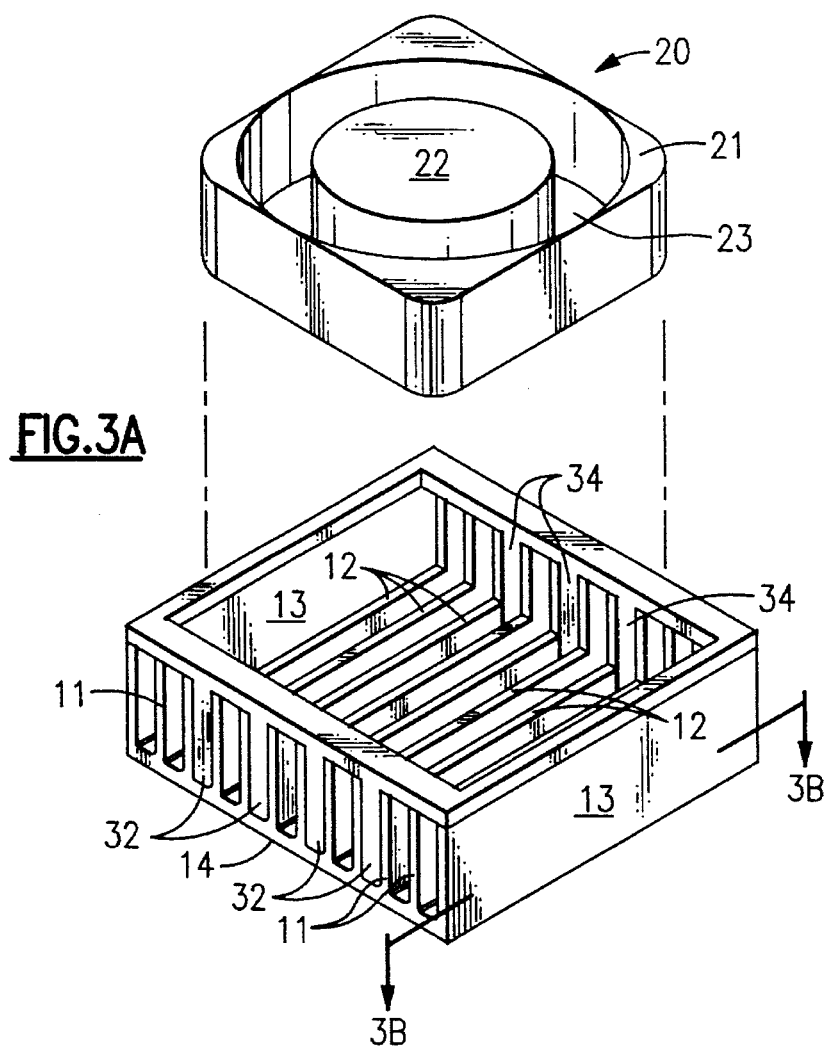
FIG. 3A is an exploded isometric view of the assembled device shown in FIG. 2B and more particularly illustrating the placement of the cooling fan.
Figure 3B:
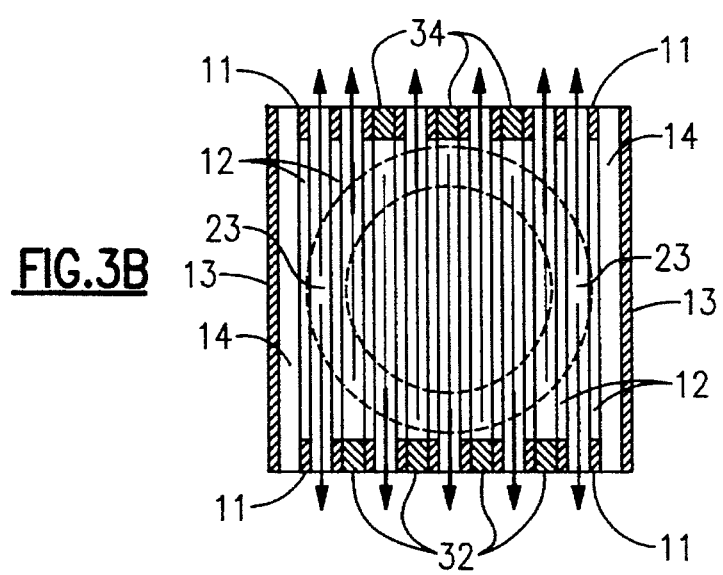
FIG. 3B is a top view illustrating the air flow in the cooling apparatus of the present invention and in particular, illustrating the flow of air in the region beneath the fan motor or hub.

It is also seen in FIGS. 2A, 2B and 3C that teeth 32 are disposed with respect to frame 31 and heat sink 10 in a staggered fashion. Staggering teeth 32 in this manner creates flow paths between parallel plates 12 which, in adjacent ones thereof, exhibit different directionality. This is also more particularly shown in FIG. 3B. In particular, it is seen that spacers or teeth 32 serve to lock alternating ones of the ends of the channels defined by fins 12. By selectively blocking these passages, air from annular volume 23 is forced to pass underneath central hub 22 of fan 20. This insures that cooling air acts to remove heat from critical chip package areas.

An alternate embodiment of the present invention is illustrated in FIG. 4A. In particular, it is seen that an enhanced flow distributor in accordance with the present invention may comprise a base member 41 from which flow blocking teeth 42 depend. As above, flow blocking teeth 42 are positioned and sized so as to fit snugly within the channels defined by fin structures 11. The resulting assembled heat sink structure is illustrated in FIG. 4B. Likewise, a top view through the section of the device shown in FIG. 4B is shown in FIG. 4C. In this particular embodiment, air flow is blocked almost entirely on one whole side of heat sink 10. Sufficient numbers of teeth are provided on enhanced flow distributor 40 to ensure that the central hub region below fan 20 is cooled. It is noted that it is not necessary that teeth 42 depending from base member 41 fill all of the slots on one side of the device. When the alternate embodiment illustrated in FIG. 4A is employed, the resultant flow pattern is that which is indicated in FIG. 4D.

With specific attention directed to the embodiment shown in FIGS. 4A–4D, it is noted that the enhanced flow distributor is formed to block flow passages on only one side of heat sink 10. The top sectioned view in FIG. 4D shows that the resulting air flow does pass underneath the fan hub as in the other embodiment. This particular embodiment may be preferred for situations where a neighboring component may cause interference with the air flow. However, the pressure field at fan blades will not be as uniform in comparison with the embodiment shown in FIGS. 4A–4D and this factor may be a consideration relevant to the life of the fan bearings.

In either of the embodiments discussed above, the enhanced flow distributor is preferably made of plastic and sized so as to be press fit into position. However, it could be stamped from springed steel to clip over the heat sink as well. Additionally, it is also noted that the objectives of the present invention may be achieved through the utilization of patterned flow blocking panels which are adhesively or otherwise affixed to the sides of heat sink 10. Such panels divide the flow in the same manner as shown in either FIGS. 4D or 3B.

The present invention has wide applicability. It may be used with spot coolers as a retrofit to existing units, as a simple design modification for currently produced units, or as an integrated feature of future designs. The invention could also be used in the hundred or so million existing personal computers in need of upgrade or replacement as well as in forthcoming workstations and servers.

It is noted that while the preferred embodiments described above include a recess or pocket in which fan 20 is disposed, it is not necessary to incorporate such a pocket. In particular, it is seen that desirable, albeit lesser advantages, may also be achieved by simply positioning a fan on top of an existing unpocketed heat sink, especially in those circumstances where overall height of the spot cooling device is not critical.

From the description above, it is seen that the invention illustrated in the figures above amply and completely meets all of the objectives indicated above. In particular, the selective blocking of exhaust paths in a parallel plate heat sink is employed to provide a more uniform flow of air across and through central regions of the heat sink. Accordingly, improved electronic device cooling is provided.

It is further noted that while the present invention has been particularly described with reference to its cooling capabilities for integrated circuit chip devices, it is also possible to employ the present invention in any circumstance where a parallel plate heat sink is employed in conjunction with an air moving device which produces an annular flow of cooling fluid. In all such circumstances, the improvements provided by the present invention are seen not only to be readily manufacturable but are also seen to be easily retrofitted to existing devices.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A heat removal apparatus for an electronic component said apparatus comprising:
   a heat sink having a base portion to be put in thermal contact with said electronic component, said base portion having parallel plate fins which define slots in said heat sink base portion, said fins being configured to provide a recess for a fan in such a way that at least a portion of at least some of said fins remain present beneath said recess for a fan;
   a fan disposed within said recess, said fan having a central motor with fan blades which are disposed so as to be rotatable in an annular volume in the vicinity of said central motor; and
   air flow directing means, disposed in said slots between said fins, to enhance air flow in a direction parallel to said fins in the area beneath said central fan motor.

2. The apparatus of claim 1 in which said air flow directing means comprises a plurality of flow blocking teeth.

3. The apparatus of claim 1 in which said teeth are staggered so that air flows in opposite directions in at least one pair of adjacent slots defined by said fins.

4. The apparatus of claim 2 in which said teeth are disposed at the same ends of slots defined by said fins.

5. The apparatus of claim 1 in which said air flow directing means comprises a patterned plate affixed to at least one side of said heat sink to block selective slots defined by said fins.

6. A heat removal apparatus for an electronic component, said apparatus comprising:
   a heat sink having a base portion with parallel plate fins defining slots there between;
   a fan having a central motor with fan blades which are disposed so as to be rotatable in an annular volume, said fan being disposed within said heat sink so as to be able to cause an annularly shaped volume of air to be directed against said base portion of said heat sink; and
   air flow directing means disposed within said slots to direct air flow in a direction parallel to said fins into a region beneath said central motor.

7. The apparatus of claim 6 wherein said air flow directing means are disposed at the end of said slots.

* * * * *